United States Patent
Cox et al.

(10) Patent No.: US 10,483,974 B2
(45) Date of Patent: *Nov. 19, 2019

(54) METHOD FOR MULTIPLEXING BETWEEN POWER SUPPLY SIGNALS FOR VOLTAGE LIMITED CIRCUITS

(71) Applicant: Apple Inc., Cupertino, CA (US)

(72) Inventors: Keith Cox, Sunnyvale, CA (US);
Victor Zyuban, Sunnyvale, CA (US);
Norman J. Rohrer, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/140,488

(22) Filed: Sep. 24, 2018

(65) Prior Publication Data

US 2019/0052271 A1 Feb. 14, 2019

Related U.S. Application Data

(63) Continuation of application No. 15/671,524, filed on Aug. 8, 2017, now Pat. No. 10,084,450.

(51) Int. Cl.
*G11C 5/04* (2006.01)
*H03K 5/01* (2006.01)
(Continued)

(52) U.S. Cl.
CPC ..... *H03K 19/017509* (2013.01); *G11C 5/147* (2013.01); *H03K 5/01* (2013.01);
(Continued)

(58) Field of Classification Search
CPC combination set(s) only.
See application file for complete search history.

(56) References Cited

U.S. PATENT DOCUMENTS 7,498,835 B1    3/2009  Rahman et al.
8,988,139 B2 *  3/2015  Phan ............... H03K 3/012
                                           327/540
(Continued)

FOREIGN PATENT DOCUMENTS

CN    102711314    10/2012
TW    201042876   12/2010

OTHER PUBLICATIONS

International Search Report and Written Opinion in Appl. No. PCT/US2018/045297 dated Oct. 12, 2018, 11 pages.
(Continued)

*Primary Examiner* — An T Luu
(74) *Attorney, Agent, or Firm* — Meyertons, Hood, Kivlin, Kowert & Goetzel, P.C.

(57) ABSTRACT

In an embodiment, a system includes a plurality of functional circuits, a power supply circuit, and a power management circuit. The power supply circuit may generate a shared power signal coupled to each of the functional circuits, and to generate a plurality of adjustable power signals. One adjustable power signal may be coupled to a particular functional circuit of the functional circuits. The power management circuit may a request to the power supply circuit to change a voltage level of the one particular adjustable power signal from a first voltage to a second voltage. The particular functional circuit may couple a respective power node for a sub-circuit of the particular functional circuit to either of the shared power signal or the particular adjustable power signal. The particular functional circuit may also be configured to maintain an operational voltage level on the power node.

20 Claims, 6 Drawing Sheets

(51) Int. Cl.
*H03K 19/0175* (2006.01)
*G11C 5/14* (2006.01)
*H03K 5/00* (2006.01)
*H02J 1/00* (2006.01)

(52) U.S. Cl.
CPC .................. *H02J 2001/008* (2013.01); *H03K 2005/00013* (2013.01)

(56) References Cited

U.S. PATENT DOCUMENTS

| | | |
|---|---|---|
| 9,059,696 B1 | 6/2015 | Rahman |
| 9,910,477 B2 | 3/2018 | Kelly et al. |
| 9,933,827 B2 | 4/2018 | Cheriyan et al. |
| 2006/0259800 A1 | 11/2006 | Maejima |
| 2014/0089690 A1 | 3/2014 | Fukuda |
| 2014/0232188 A1 | 8/2014 | Cheriyan et al. |
| 2017/0139469 A1 | 5/2017 | Stewart et al. |

OTHER PUBLICATIONS

Office Action in Taiwanese Appl. No. 107127598 dated Apr. 3, 2019, 8 pages.

* cited by examiner

METHOD FOR MULTIPLEXING BETWEEN POWER SUPPLY SIGNALS FOR VOLTAGE LIMITED CIRCUITS

The present application is a continuation of U.S. application Ser. No. 15/671,524, filed Aug. 8, 2017 (now U.S. Pat. No. 10,084,450); the disclosure of the above-referenced application is incorporated by reference herein in its entirety.

BACKGROUND

Technical Field

Embodiments described herein are related to the field of integrated circuits, and more particularly to power management of an integrated circuit.

Description of the Related Art

Some integrated circuits (ICs), including some systems-on-a-chip (SoCs) may include various functional circuits with different power supply voltage levels. A power supply rail may be utilized to provide power with a particular voltage level to functional circuits using the particular voltage level. Some functional circuits may receive power from multiple power rails, as different portions of a given functional circuit may use different voltage levels. For example, to conserve power, a first portion of a circuit may utilize a low voltage level when it is operating in a reduced power mode and a higher voltage level when fully operational. A second portion of the circuit may utilize a third voltage level, higher than the low voltage level of the first portion of the circuit, in the reduced power mode and the higher voltage level when fully operational.

In some cases, the first portion of the circuit may be coupled to a first power supply signal that is adjustable between the low voltage level and the higher voltage level, while the second portion of the circuit is coupled to a second power supply signal that is adjustable between the third voltage level and the higher voltage level. In the reduced power mode, the first and second power signals may be set to the low voltage level and the third voltage level, respectively. When the circuit is to be fully operational, both the first and second power supply signals may be set to the higher voltage level. If an SoC includes several circuits that utilize multiple power signals, then a power supply for the SoC may generate many different power supply signals to allow each circuit to utilize suitable voltage levels.

SUMMARY OF THE EMBODIMENTS

Various embodiments of a processor are disclosed. Broadly speaking, a system, an apparatus, and a method are contemplated in which the system includes a plurality of functional circuits, a power supply circuit, and a power management circuit. The power supply circuit may be configured to generate a shared power signal coupled to a respective first sub-circuit included in each of the plurality of functional circuits, and to generate a plurality of adjustable power signals, wherein one adjustable power signal of the plurality of adjustable power signals is coupled to a particular functional circuit of the plurality of functional circuits. The power management circuit may be configured to send a request to the power supply circuit to change a voltage level of the one particular adjustable power signal from a first voltage level to a second voltage level. The particular functional circuit may be configured to selectively couple a respective power node for a second sub-circuit included in the particular functional circuit to either of the shared power signal or the particular adjustable power signal based on a control signal. The particular functional circuit may also be configured to maintain an operational voltage level on the power node when selectively coupling the power node to either of the shared power signal or the particular adjustable power signal.

In a further embodiment, the power management circuit may be further configured to assert the control signal in response to a determination that the first voltage level is less than a voltage level of the shared power signal and the second voltage level is greater than the voltage level of the shared power signal. In another embodiment, to change the voltage level of the particular adjustable power signal from the first voltage level to the second voltage level, the power supply circuit may be further configured to change the voltage level of the particular adjustable power signal to an intermediate voltage level in response to the request from the power management circuit. The power management circuit may be further configured to assert the control signal to cause the particular functional circuit to selectively couple the respective power node for the second sub-circuit to the particular adjustable power signal based on a control signal.

In one embodiment, the power supply circuit may be further configured to change the voltage level of the particular adjustable power signal to the second voltage level in response to an assertion of an acknowledge signal. The first functional circuit may be further configured to assert the acknowledge signal in response to a determination that the second power node is coupled to the particular adjustable power signal. In an embodiment, the intermediate voltage level may be greater than both the first voltage level and the second voltage level.

In a further embodiment, another functional circuit of the plurality of functional circuits may be configured to selectively couple a respective power node for a respective second sub-circuit to either of the shared power signal or another adjustable power signal based on another control signal. In another embodiment, the power management circuit is further configured to assert the another control signal in response to a determination that the particular functional circuit is not transitioning between the shared power signal and the another adjustable power signal.

BRIEF DESCRIPTION OF THE DRAWINGS

The following detailed description makes reference to the accompanying drawings, which are now briefly described.

Figure 1:
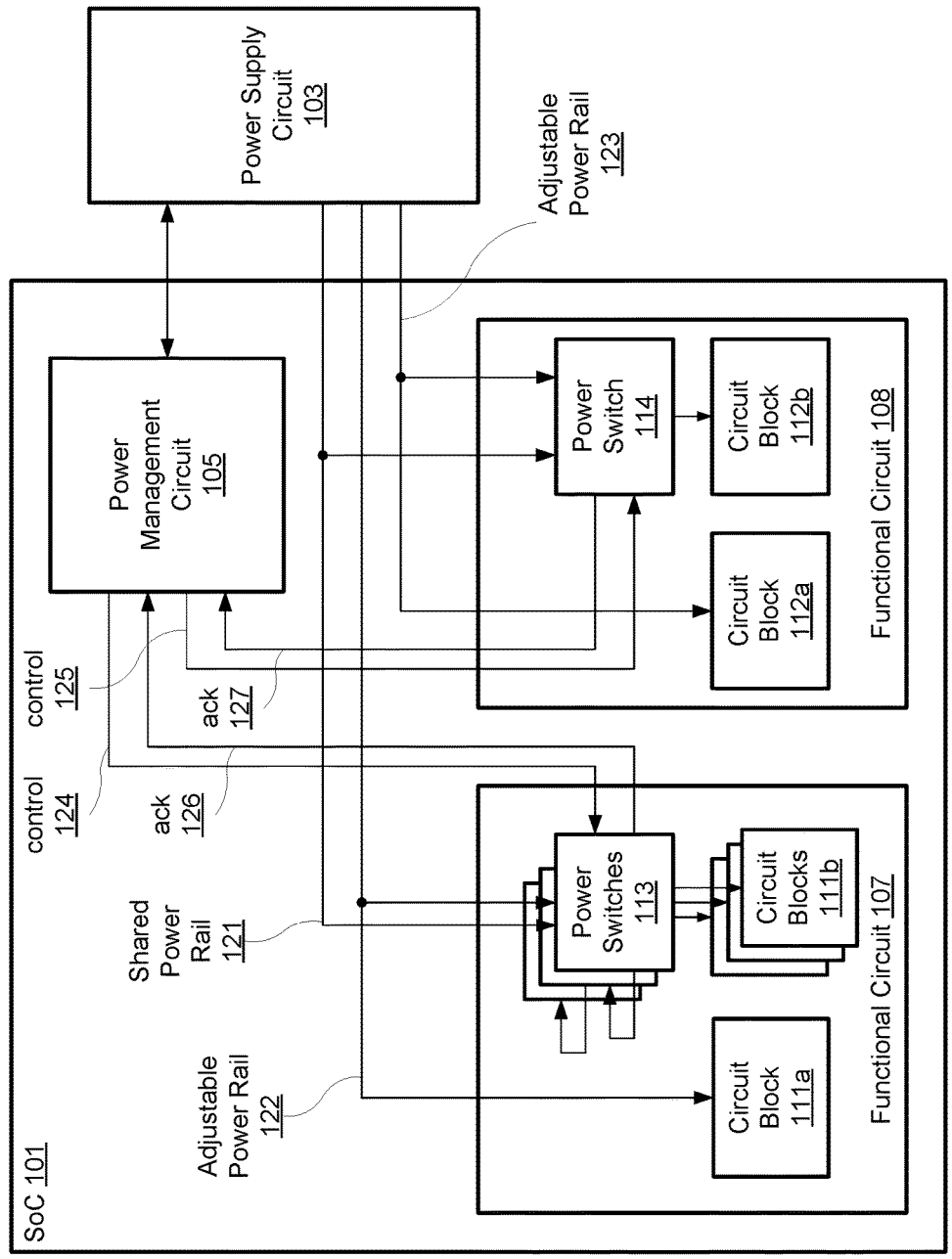
FIG. 1 illustrates a block diagram of an embodiment of an SoC with multiple power rails.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

DETAILED DESCRIPTION OF EMBODIMENTS

An SoC may include multiple circuits in which each of the multiple circuits utilizes more than one power supply signal. For example, a given SoC may include three functional circuits that include digital logic circuits in combination with a respective static random access memory (SRAM) array. The digital logic in each of the functional circuits may function at a lower power supply voltage level than the SRAM, and therefore, be coupled to a different power supply rail than the SRAM. Additionally, the voltage level of the power supply rail for each of the functional circuits may be increased and decreased to match a current performance level of each of the functional circuits. In some cases, the voltage level may change from a level below the level of the SRAM power supply rail, to a level above the SRAM power supply rail. In some embodiments, the voltage level of the SRAM power rail may be raised to match the level of the digital logic power rail when the voltage level of the digital logic is above the voltage level of the SRAM. To accomplish this, in some embodiments, the SoC may include a power rail for each power supply signal utilized by each of the three functional circuits, resulting in the power supply generating six different power supply signals for the three functional circuits, in addition to any other power supply signals used in other parts of the SoC.

A system is desired to reduce a number of power signals generated by a power supply for functional circuits in an SoC. The disclosed embodiments may demonstrate methods and systems for transitioning a circuit from a first power rail to a second power rail without disrupting operation of the circuit.

Many terms commonly used in reference to SoC designs are used in this disclosure. For the sake of clarity, the intended definitions of some of these terms, unless stated otherwise, are as follows.

A Metal-Oxide Semiconductor Field-Effect Transistor (MOSFET) describes a type of transconductive device that may be used in modern digital logic designs. MOSFETs are designed as one of two basic types, n-channel and p-channel. Both N-channel and P-channel MOSFETs open a conductive path between the source and drain when a positive voltage greater than the device's threshold voltage is applied between the gate and the source.

Complementary MOSFET (CMOS) describes a circuit designed with a mix of n-channel and p-channel MOSFETs. In CMOS designs, n-channel and p-channel MOSFETs may be arranged such that a high level on the gate of a MOSFET turns an n-channel device on, i.e., opens a conductive path, and turns a p-channel MOSFET off, i.e., closes a conductive path. Conversely, a low level on the gate of a MOSFET turns a p-channel on and an n-channel off. In addition, the term transconductance is used in parts of the disclosure. While CMOS logic is used in the examples, it is noted that any suitable digital logic process may be used for the circuits described in this disclosure.

It is noted that "high," "high level," and "high logic level" refer to a voltage sufficiently large to turn on a n-channel MOSFET and turn off a p-channel MOSFET while "low," "low level," and "low logic level" refer to a voltage that is sufficiently small enough to do the opposite. As used herein, a "logic signal" refers to a signal that transitions between a high logic level and a low logic level. In various other embodiments, different technology may result in different voltage levels for "low" and "high."

The embodiments illustrated and described herein may employ CMOS circuits. In various other embodiments, however, other suitable technologies may be employed.

A block diagram of an embodiment of an SoC with multiple power rails is illustrated in FIG. 1. In the illustrated embodiment, SoC 101 includes Power Management Circuit 105, and Functional Circuits 107 and 108. SoC 101 further includes Shared Power Rail 121 and Adjustable Power Rails 122 and 123. Functional Circuits 107 and 108 each include respective Circuit Blocks 111*a-b* and 112*a-b*, as well as respective Power Switches 113 and 114. Power Management Circuit 105 is coupled to Power Supply Circuit 103, which, in turn, provides power signals to Shared Power Rail 121 and Adjustable Power Rails 122 and 123. In various embodiments, SoC 101 and Power Supply Circuit 103 may be configured for use in a computing application such as, e.g., a desktop computer, a notebook computer, a tablet computer, a smartphone, or a wearable device.

SoC 101 includes Functional Circuits 107 and 108. In various embodiments, Functional Circuits 107 and 108 may perform any of various functions within SoC 101. For example, either of Functional Circuits 107 and 108 may correspond to any of a processor core, a graphics processor, an audio processor, a security processor, a network interface, a camera interface, and the like. Circuit Blocks 111*a* and 112*a* in Functional Circuits 107 and 108, respectively, are each coupled to Adjustable Power Rails 122 and 123, respectively. Circuit Blocks 111*a* and 112*a* may correspond to digital logic or other types of circuits capable of operating across a wide range of power supply voltage levels, depending on a desired performance level. Circuit Blocks 111*b* and 112*b*, in contrast, may not be operable with a supply voltage as low as that of Circuit Blocks 111*a* and 112*a*, respectively. Each of Circuit Blocks 111*b* and 112*b* are coupled to Power Switches 113 and 114, respectively. It is noted that Circuit Blocks 111*b* is illustrated as a collection of three blocks. In some embodiments, Circuit Blocks 111*b* may include any suitable number of circuits, each circuit coupled to a respective output from Power Switches 113.

Circuit Block 112*b* is coupled to Power Switch 114 and Circuit Blocks 111*b* are coupled to Power Switches 113. In some embodiments, Power Switches 113 may include a respective power switch for each circuit block included in Circuit Blocks 111*b*. Power Switches 113 are coupled to Shared Power Rail 121 and Adjustable Power Rail 122, while Power Switch 114 is coupled to Shared Power Rail 121 and Adjustable Power Rail 123. As used herein, a "power rail" refers to a circuit node or wire that conducts a power signal to various circuits coupled to the power rail. Shared Power Rail 121, in the illustrated embodiment, is coupled to Functional Circuit 107 and Functional Circuit 108, and may also be coupled to additional functional circuits in SoC that are not shown. While SoC 101 is operational, a voltage level of Shared Power Rail 121 may maintained at a suitably constant voltage level. It is noted, however, that a constant voltage level may include some deviation due to various external or internal conditions, such as, for example, switching noise from various other circuits, or noise from a voltage regulating circuit used to supply voltage signals.

Adjustable Power Rail 122 is coupled to Functional Circuit 107 and Adjustable Power Rail 123 is coupled to Functional Circuit 108. In various embodiments, either or both of the adjustable power rails may be coupled to other functional circuits. SoC 101 may include additional adjustable power rails for other functional circuits. Voltage levels for Adjustable Power Rails 122 and 123 may be varied to a suitable level to match a current power usage of Functional Circuits 107 and 108, respectively. For example, when Functional Circuit 107 is idle or has few tasks to perform, then a frequency of a clock signal provided to Functional Circuit 107 may be reduced to conserve power. In combination with a reduced clock frequency, the voltage level of Adjustable Power Rail 122 may be lowered to further reduce power consumption. In contrast, when Functional Circuit 107 is active or has many tasks to perform, then the frequency of the received clock signal may be increased to increase a processing performance. The voltage level of Adjustable Power Rail 122 may be increased before increasing the frequency of the received clock signal in order to supply adequate power for the higher operating frequency.

In the illustrated embodiment, Power Switches 113 and 114 each output a local power signal based on either the voltage level of Shared Power Rail 121, or the voltage level of a respective one of Adjustable Power Rail 122 and 123. Values of Control Signals 124 and 125, respectively, determine which voltage level Power Switches 113 and 114 output. Power Management Circuit 105 generates Control Signals 124 and 125 based on operational states of Functional Circuits 107 and 108. The operational states, in various embodiments, may correspond to an idle state, an active state, a reduced power state, a high performance state, and the like. The operational state may determine a particular voltage level for the local power signal in each of Functional Circuits 107 and 108. To set voltage level for the respective local power signals, Power Management Circuit 105 sends requests to Power Supply Circuit 103 to set voltage levels for power signals distributed via Adjustable Power Rails 122 and 123 to correspond with the operational states of Functional Circuits 107 and 108. Power Supply Circuit 103 generates a voltage level on Shared Power Rail 121 that is at least at a voltage level high enough to power any circuit that is coupled to Shared Power Rail 121. In various embodiments, Power Management Circuit 105 may request a particular voltage level for Shared Power Rail 121, or Power Supply Circuit 103 may be designed to output a particular voltage level for Shared Power Rail 121.

In the illustrated embodiment, when Functional Circuit 107 is in a reduced power state, Power Management Circuit 105 requests a low voltage level for Adjustable Power Rail 122 and asserts a value on Control Signal 124 to cause Power Switches 113 to output a local power signal with a voltage level based on the voltage level of Shared Power Rail 121. Power Switch 113 may assert Acknowledge (ack) Signal 126 to indicate that the Circuit Blocks 111*b* have been switched to Shared Power Rail 121. In this reduced power state, Circuit Block 111*a* is operating at a voltage level based on Adjustable Power Rail 122 while Circuit Blocks 111*b* are operating at a voltage level based on Shared Power Rail 121, higher than the voltage level of Adjustable Power Rail 122.

At a point in time, Functional Circuit 107 may be placed into a fully operational state. Power Management Circuit 105 then sends a request to Power Supply Circuit 103 to increase the voltage level of Adjustable Power Rail 122 to provide adequate power to Circuit Block 111*a*. This increased voltage level may be greater than the voltage level of Shared Power Rail 121, and, therefore, Power Management Circuit 105 may assert a value on Control Signal 124 to cause Power Switch 113 to output a voltage level based on Adjustable Power Rail 122 instead of Shared Power Rail 121. Since Shared Power Rail 121 may be coupled to circuits other than Circuit Blocks 111*b*, the voltage level of Shared Power Rail 121 is kept at a suitably low voltage level that provides adequate power for any circuit that may be coupled to it. Power Switch 113, may not switch from Shared Power Rail 121 to Adjustable Power Rail 122 until the voltage level of Adjustable Power Rail 122 has reached or exceeded the voltage level of Shared Power Rail 121. When Power Switch 113 switches from Shared Power Rail 121 to Adjustable Power Rail 122, each output of Power Switch 113 that is coupled to a respective one of Circuit Blocks 111*b* may be switched in a particular sequence, such as one-by-one, allowing a first circuit of Circuit Blocks 111*b* to reach the new voltage level before switching a next circuit. In various embodiments, Power Switch 113 may assert a single Acknowledge Signal 126 to indicate that all Circuit Blocks 111*b* have been switched to Adjustable Power Rail 122, or may assert a respective Acknowledge Signal 126 (not shown) as each circuit in Circuit Blocks 111*b* is switched to Adjustable Power Rail 122.

When Functional Circuit 107, in the illustrated embodiment, returns from the fully operational state back to the reduced power state, a similar process occurs. Power Management Circuit 105 requests a voltage level for Adjustable Power Rail 122 that is adequate for the reduced power state. Power Management Circuit 105 asserts a value on Control Signal 124 causing Power Switch 113 to output a voltage level based on Shared Power Rail 121 again. Power Switch 113 may follow a same sequence for switching each output to Shared Power Rail 121, or, in other embodiments, may follow a reverse, or otherwise different, sequence for switching each output for each of Circuit Blocks 111*b*. Power Switch 113 asserts acknowledge signal, accordingly, when Circuit Blocks 111*b* are switched to Shared Power Rail 121. Functional Circuit 108 follows a similar process with Power Switch 114 to supply power to Circuit Block 112*b*.

In some embodiments, the plurality of switches in Power Switches 113 may be configured to switch between Adjustable Power Rail 122 and Shared Power Rail 121 one at a time. By switching between the power rails one at a time, a voltage level spike and/or voltage level droop may be avoided or reduced by staggering the switching between the power rails rather than letting all Circuit Blocks 111*b* be switched between the power rails in unison. For example, in the illustrated embodiment, a first switch in Power Switches 113 receives a value on Control Signal 124 indicating a switch from Shared Power Rail 121 to Adjustable Power Rail 122. The first switch performs the switch for a first circuit of Circuit Blocks 111*b* and once complete, asserts a first acknowledge signal. This first acknowledge signal is received by a second switch in Power Switches 113 as a control signal indicating the switch from Shared Power Rail 121 to Adjustable Power Rail 122. In some embodiments, the first acknowledge signal may be a delayed version of Control Signal 124. The second switch performs the switch for a second circuit block, and once complete, asserts a second acknowledge signal, which may correspond to further delayed version of Control Signal 124. A third switch in Power Switches 113 receives this second acknowledge signal indicating the switch from Shared Power Rail 121 to Adjustable Power Rail 122, and performs the switch for a third circuit block in Circuit Blocks 111*b*, accordingly. After completing the switch, a third acknowledge signal, corresponding to Acknowledge Signal 126, is asserted. Although three pairs of Circuit Blocks 111*b* and Power Switches 113 are in FIG. 1, any suitable number of circuit blocks may be included and may be serially linked as just described.

It is noted that the block diagram illustrated in FIG. 1 is merely an example. In other embodiments, different circuit blocks, and different configurations of circuit blocks may be possible dependent upon the specific application for which the corresponding circuit is intended. In other embodiments, an SoC may include any suitable number of functional circuits, any portion of which may receive power from more than one power rail. Accordingly, a corresponding number of adjustable power rails may be included in such embodiments.

Figure 2:
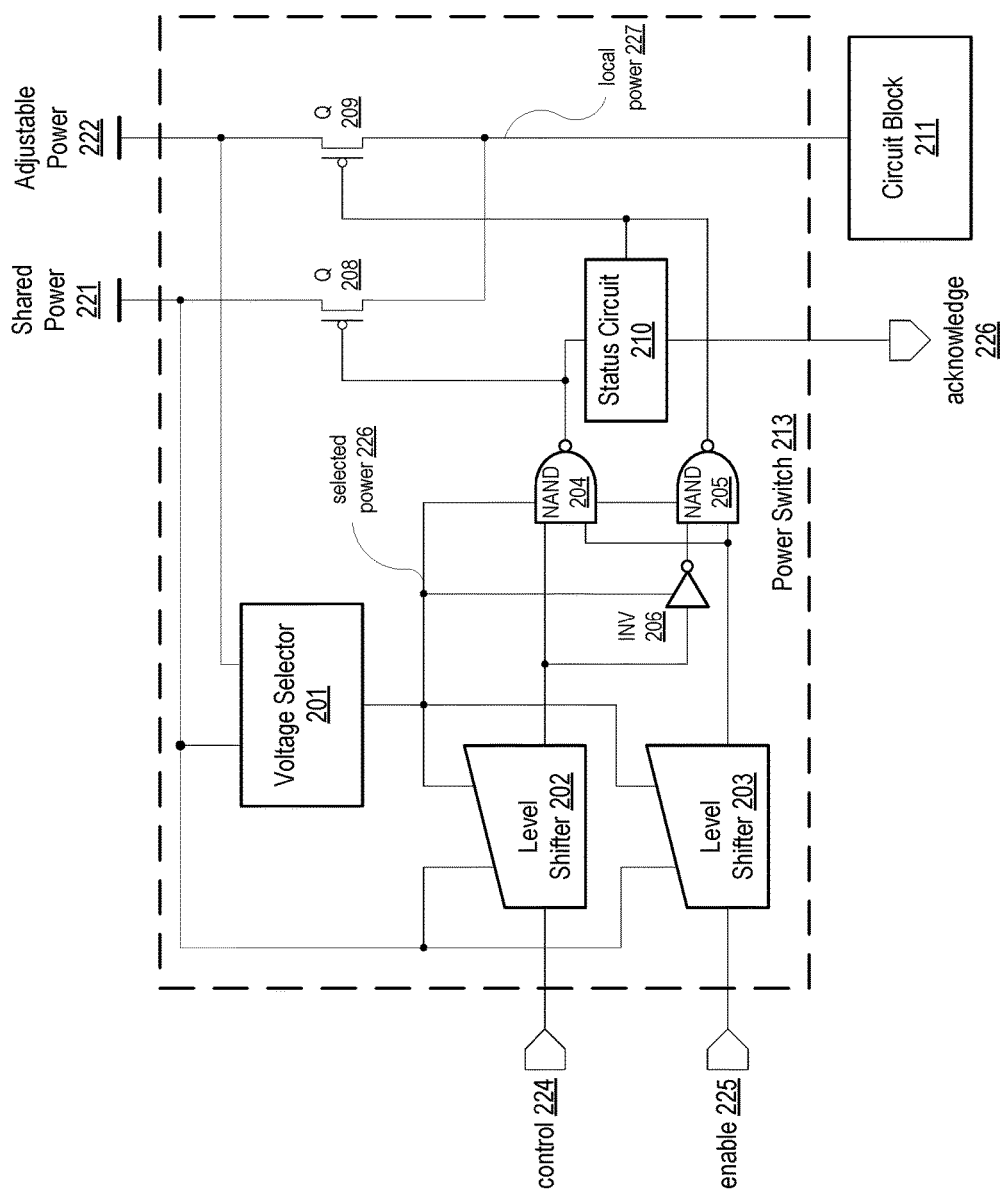
FIG. 2 shows a block diagram of an embodiment of a power multiplexing circuit.

Turning to FIG. 2, a block diagram of an embodiment of a power multiplexing circuit is shown. Power Switch 213 may, in some embodiments, correspond to Power Switch 113 or 114 in FIG. 1. Power Switch 213 includes Voltage Selector 201, Level Shifters 202 and 203, logic gates NAND 204 and NAND 205, inverting circuit INV 206, and transistors Q 208 and Q 209. Power Switch 213 is coupled, via local power signal 227, to Circuit Block 211, which, in some embodiments, may correspond to a circuit in Circuit Block 111*b* or to Circuit Block 112*b* in FIG. 1. Power Switch 213 is also coupled to Shared Power Rail 221 and to Adjustable Power Rail 222, each of which may correspond to similarly named and numbered items in FIG. 1. Power Switch 213 receives control signal 224 and enable signal 225.

In the illustrated embodiment, Power Switch 213 is used to generate local power signal 227 based on either the voltage level of Shared Power Rail 221 or Adjustable Power Rail 222. A value of control signal 224 is used to select between the two power rails. Another value on enable signal 225 is used to enable or disable local power signal 227. When enable signal 225 is a logic low value, then If control signal 224 has a logic high value, then at least one input to each of NANDs 204 and 205 is low, causing the outputs of both NANDs 204 and 205 to be logic high. The high values cause both Q 208 and Q 209 to restrict current flow to local power signal 227. Circuit Block 211*b* may powered down as a result.

Although Q 208 and Q 209 are illustrated as MOSFETs in FIG. 2, any suitable type of transconductive device may be utilized in other embodiments. In some embodiments, each of Q 208 and Q 209 may be implemented using more than one device. In the illustrated embodiment, Q 208 and Q 209 are shown with three terminals. In other embodiments, Q 208 and Q 209 may include a fourth node coupled to a bulk connection. In such embodiments, this bulk connection for Q 208 and Q 209 may be coupled to Shared Power Rail 221 and Adjustable Power Rail 222, respectively, or to any other suitable signal.

When enable signal 225 is a logic high value, then the output values of NANDs 204 and 205 are determined by the value of control signal 224. A high value on control signal 224 results in a low value from NAND 204 and a high value from NAND 205, thereby turning Q 208 on and Q 209 off. Local power signal 227 is then generated from Shared Power Rail 221. Likewise, a low value on control signal 224 results in a high value from NAND 204 and a low value from NAND 205. Q 208 is turned off and Q 209 is turned on, resulting in local power signal 227 being generated from Adjustable Power Rail 222. Outputs of NAND 204 and NAND 205 may be designed to transition from high values to low values faster than transitions from low values to high values. This may create a brief time period in which both Q 208 and Q 209 are on, thereby creating a make-before-break connection. A "make-before-break" connection, as used herein, refers to a switch that temporarily couples two or more signals together before disconnecting one of the signals. Using a make-before-break connection may avoid local power signal 227 from being temporarily unpowered if both Q 208 and Q 209 were to be off at the same time during the switch between power rails.

Status Circuit 210 receives the outputs from NAND gates 204 and 205 and generates acknowledge signal 226. In some embodiments, Status Circuit 210 may assert acknowledge signal 226 to reflect a current state of control signal 224. For example, when control signal 224 is high, thereby selecting Shared Power Rail 221, the acknowledge signal 226 may also be asserted high based on the low output from NAND 204 and high value from NAND 205, and vice versa when control signal 224 is low. In other embodiments, Status Circuit 210 may assert a pulse on acknowledge signal 226 in response to a change in the output of either NAND 204 or NAND 205. Acknowledge signal 226 may be sent to a power management unit, such as, for example, Power Management Circuit 105 in FIG. 1.

To turn Q 208 and Q 209 off, a voltage level of the outputs of NANDs 204 and 205 may need to be close to the voltage level of Shared Power Rail 221 and Adjustable Power Rail 222, respectively. In the illustrated embodiment, to help NANDs 204 and 205 generate a sufficiently high voltage level when generating a high output value, Voltage Selector 201 is used to select, as an output, the higher voltage level between the levels on Shared Power Rail 221 and Adjustable Power Rail 222. The output of Voltage Selector 201 is used to power NAND 204, NAND 205, INV 206, and an output portion of Level Shifters 202 and 203. Level Shifters 202 and 203 may be used to modify logic high voltage levels of control signal 224 and enable signal 225 from the voltage level of Shared Power Rail 221 to the level of Adjustable Power Rail 222 when the level of Adjustable Power Rail 222 is greater than the level of Shared Power Rail 221.

It is noted that, to improve clarity and to aid in demonstrating the disclosed concepts, the block diagram illustrated in FIG. 2 has been simplified. In other embodiments, different and/or additional circuits and different configurations of the circuits are possible and contemplated.

Figure 3:
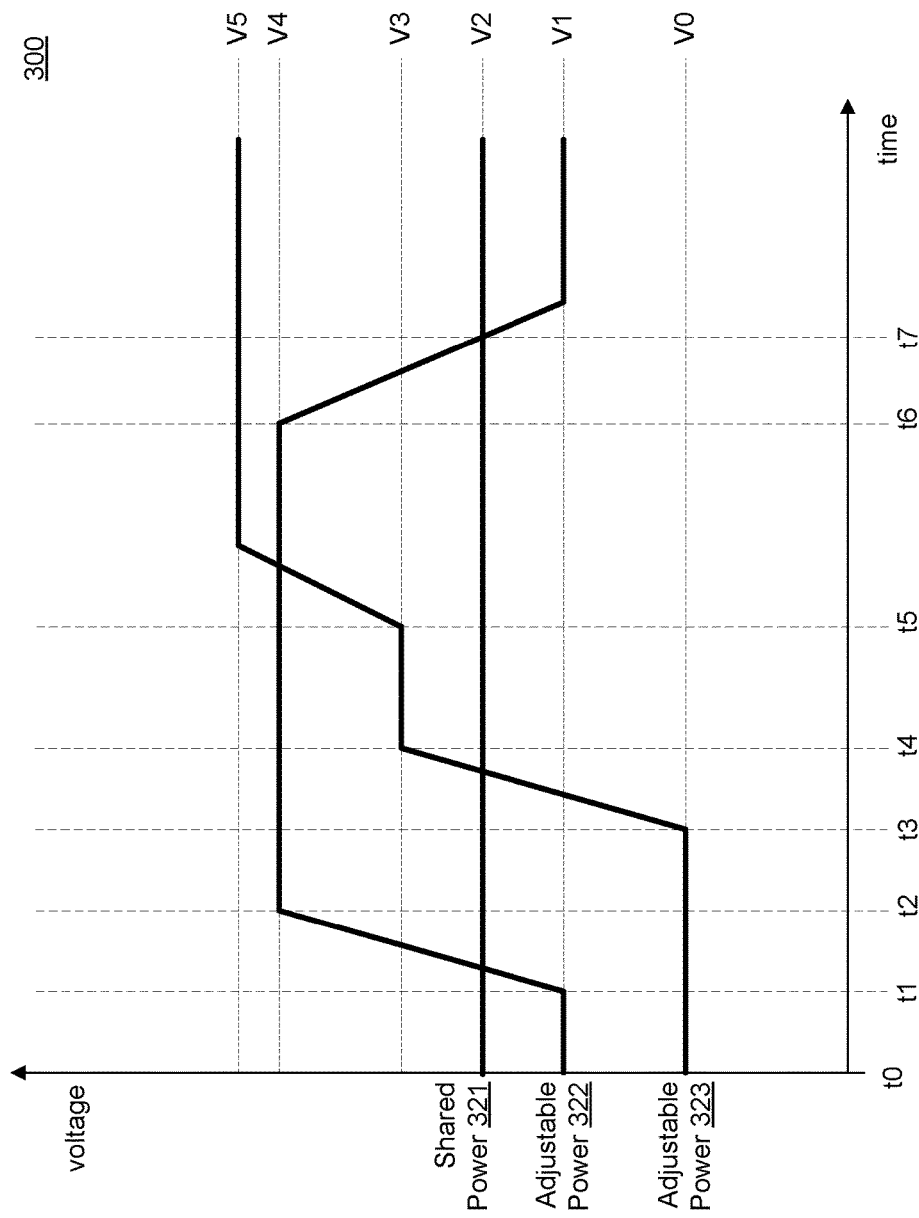
FIG. 3 depicts a chart of an embodiment of a timing diagram illustrating voltage levels of various power signals associated with an SoC.

Moving to FIG. 3, a chart of an embodiment of a timing diagram illustrating voltage levels of various power signals associated with an SoC is shown. In the illustrated embodiment, Chart 300 corresponds to signals associated with power management in an SoC, such as, for example, SoC 101 in FIG. 1. Chart 300 includes three signals that correspond to voltage levels versus time for the similarly named and numbered power rails in SoC 101: Shared Power 321, Adjustable Power 322, and Adjustable Power 323.

Chart 300 illustrates how voltage levels on Adjustable Power Rails 122 and 123 of SoC 101 may vary in relation to Shared Power Rail 121 over time. At time t0, the voltage level of Shared Power 321 is greater than the voltage level of Adjustable Power 322, which in turn, is greater than Adjustable Power 323. In the illustrated embodiment, Adjustable Power 322 represents the voltage level of Adjustable Power Rail 122 that provides power to Function Circuit 107. Likewise, Adjustable Power 323 represents the voltage level of Adjustable Power Rail 123 that provides power to Functional Circuit 108. At time t0, both Functional Circuits 107 and 108 may be in respective reduced power modes and, accordingly, both Circuit Blocks 111b and 112b may be coupled to Shared Power 321.

At time t1, Functional Circuit 107 may begin a transition from the reduced power mode to an active mode. As part of the transition to the active mode, the voltage level of Adjustable Power 322 may be raised from V1 to V4. Accordingly, Power Management Circuit 105 also sends a request to Power Supply Circuit 103 to increase the level of Adjustable Power 322 from V1 to V4. In some embodiments, Power Management Circuit 105 may assert a value on Control Signal 124 to cause Power Switch 113 to begin switching circuits in Circuit Blocks 111b from Shared Power 321 to Adjustable Power 322 once the level of Adjustable Power 322 reaches V2, the same as Shared Power 321. In other embodiments, Power Management Circuit 105 may wait to assert the value on Control Signal 124 until Adjustable Power 322 reaches V4 at time t2. In response to the asserted value on Control Signal 124, Power Switches 113 will begin switching circuits in Circuit Blocks 111b from Shared Power 321 to Adjustable Power 322.

In the illustrated embodiment, while Adjustable Power 322 transitions from V1 to V4 and Power Switches 113 transition from Shared Power 321 to Adjustable Power 322, Functional Circuit 108 may begin a transition from the reduced power mode to the active mode. As part of this transition, Functional Circuit 108 may send a request to Power Management Circuit 105 to transition Adjustable Power 323 from V0 to V3. Power Management Circuit 105 may, however, delay forwarding the request to Power Supply Circuit 103 until the transitions of Adjustable Power 322 and Power Switches 113 have completed. At time t3, Power Switches 113 complete transitioning from Shared Power 321 to Adjustable Power 322. A last switch of Power Switches 113 asserts Acknowledge Signal 126, and in response, Power Management Circuit 105 may now send a request to Power Supply Circuit 103 to increase the level of Adjustable Power 323 from V0 to V3. As with Adjustable Power 322, in some embodiments, Power Switch 114 may begin switching Circuit Block 112b from Shared Power 321 to Adjustable Power 323 once the level of Adjustable Power 323 reaches V2. In other embodiments, Power Switch 114 may wait until Adjustable Power 323 reaches V3 at time t4, and then begin switching Circuit Block 112b from Shared Power 321 to Adjustable Power 323.

At time t5, Functional Circuit 108 may indicate to Power Management Circuit 105 that the level of Adjustable Power 323 is to be increased from V3 to V5. Since both V3 and V5 are above the level of Shared Power 321 (V3), Power Switch 114 may keep Circuit Block 112b coupled to Adjustable Power 323 as the level is raised to V5.

Functional Circuit 107, at time t6, begins a process to re-enter a reduced power state. Functional Circuit 107 indicates to Power Management Circuit 105 that the level of Adjustable Power 322 is to be reduced to V1. Since the current level of Adjustable Power 322 (V4) is greater than the level of Shared Power 321 (V2), and the new level (V1) is less than V2, Power Switches 113 transition Circuit Blocks 111b to Shared Power 321 before the level of Adjustable Power 322 falls below V2. In some embodiments, Power Switches 113 may switch from Adjustable Power 322 before Power Management Circuit 105 issues a request to Power Supply Circuit 103 to change the level of Adjustable Power 322. For example, the last switch of Power Switches 113 may assert an indication signal, via, for example, Control Signal 124, in response to completing the transition of Circuit Blocks 111b to Shared Power 321. Upon detecting the assertion of Control Signal 124, Power Management Circuit 105 may issue the request to Power Supply Circuit 103 to reduce the level of Adjustable Power 322. In other embodiments, the time for the level of Adjustable Power 322 to fall from V4 to V2 may be adequate for Power Switches 113 to transition Circuit Blocks 111b to Shared Power 321, and Power Management Circuit 105 may, therefore, issue the request to Power Supply Circuit 103 without waiting for an indication.

In some embodiments, instead of comparing the current voltage level of Adjustable Power 322 and the new voltage level of Adjustable Power 322 to the voltage level of Shared Power 321, the current and new voltage levels of Adjustable Power 322 may be compared to a threshold voltage level. This threshold voltage level may differ from the voltage level of Shared Power 321 by an offset value. For example, if the current voltage level of Adjustable Power 322 is greater than both the voltage level of Shared Power 321 and the threshold voltage, and the new voltage level of Adjustable Power 322 is less than the voltage level of Shared Power 321 but greater than the threshold voltage, then Power Management Circuit 105 may not assert Control Signal 124, and instead let Circuit Blocks 111b remain coupled to Adjustable Power 322. In such embodiments, the value of the offset may be programmable, for example, by Power Management Circuit 105 or by a processor included in SoC 100. Such a programmable offset value may be set to positive voltage levels, negative voltage levels, or zero volts. An offset value of zero volts may result in Power Management Circuit 105 asserting Control Signal 124 any time the voltage level of Adjustable Power 322 or 323 crosses the level of Shared Power 321, as has been described above.

It is noted chart 300 illustrated in FIG. 3 is merely an example. The signals depicted in chart 300 are simplified for clarity. In other embodiments, the voltage level waveforms may differ due to, for example, loads from other circuitry coupled to each respective power rail.

Figure 4:
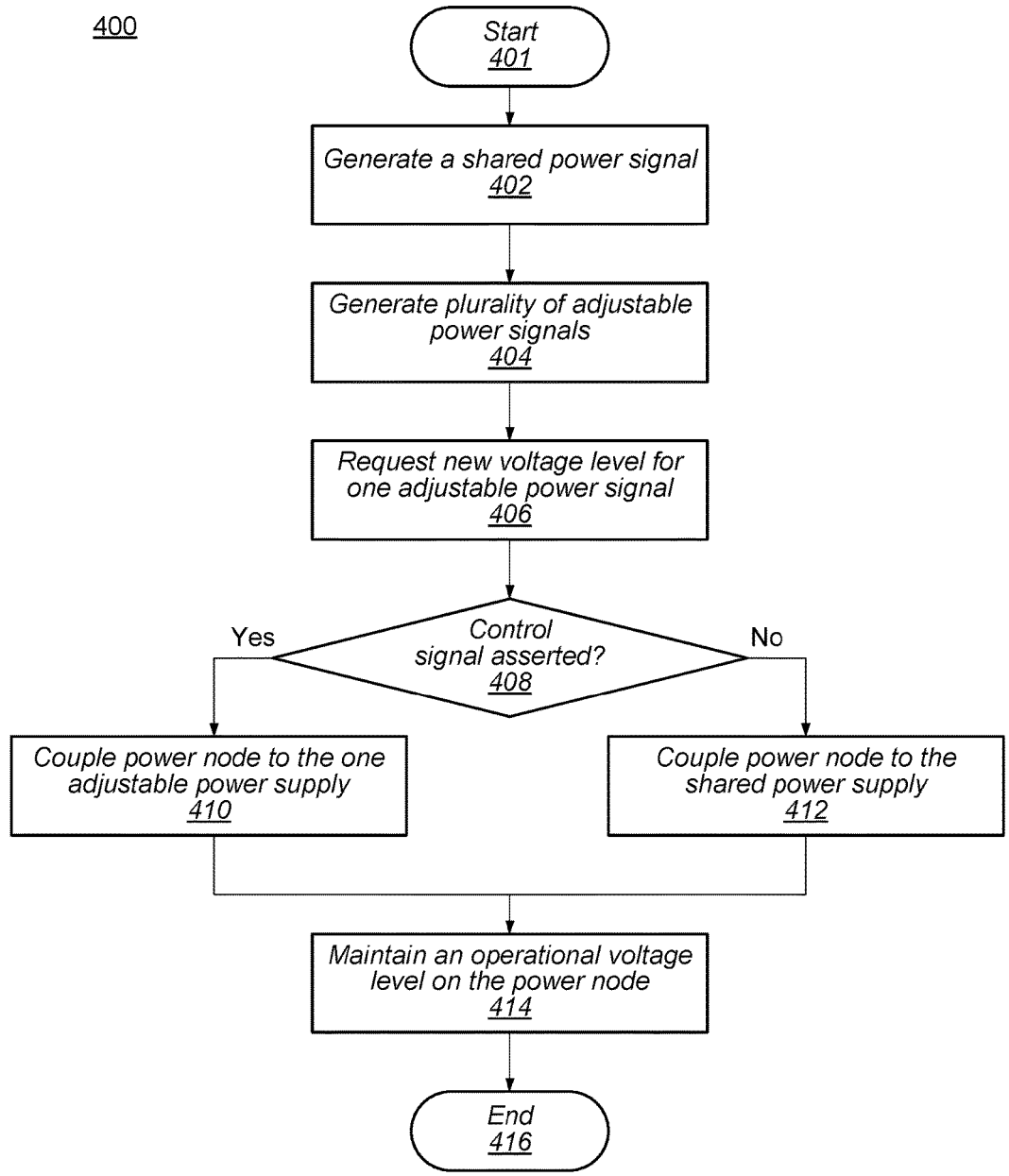
FIG. 4 illustrates a flow diagram of an embodiment of a method for multiplexing power signals in an SoC.

Turning now to FIG. 4, a flow diagram of an embodiment of a method for multiplexing power signals in an SoC is illustrated. Method 400 may be applied to an SoC, such as, for example, SoC 101 in FIG. 1, including a power switch such as, for example, Power Switch 213 in FIG. 2. Referring collectively to FIG. 1 and the method of FIG. 4, method 400 begins in block 401.

A power supply unit generates a shared power signal (block 402). In the illustrated embodiment, a power supply unit, such as, for example, Power Supply Circuit 103, generates a power signal coupled to Shared Power Rail 121 in SoC 101. A voltage level of Shared Power Rail 121 may be set by Power Management Circuit 105, or in other embodiments, may be a default or predetermined voltage level determined by Power Supply Circuit 103. The voltage level may be selected to satisfy a minimum power level for any circuit block coupled to Shared Power Rail 121. For example, one embodiment of SoC 101 may include various SRAM arrays with a minimum operating voltage level of 875 millivolts (mV) as well as one or more analog circuits with a minimum operating voltage level of 925 mV. If only SRAM arrays will be coupled to Shared Power Rail 121, then the voltage level may be set to 875 mV. Otherwise, if at least one analog circuit is coupled to Shared Power Rail 121, then the voltage level may be set to 925 mV.

The power supply unit generates a plurality of adjustable power signals (block 404). Power Supply Circuit 103 generates a respective adjustable power signal for Adjustable Power Rails 122 and 123. In some embodiments, Power Supply Circuit 103 may generate additional power signals for additional power rails not shown in FIG. 1. Initial voltage levels for Adjustable Power Rails 122 and 123 may be set by Power Management Circuit 105 or may be set to a default voltage level until a new level is received from Power Management Circuit 105.

A new voltage level for one of the adjustable power signals is requested (block 406). In some embodiments, Power Management Circuit 105 prepares a functional circuit, such as, for example, Functional Circuit 108, for a change from a reduced power state to an active state. In other embodiments, Functional Circuit 108 may send a request to Power Management Circuit 105 to change from the reduced power state to the active state. As part of the transition process, Power Management Circuit 105 sends a request to Power Supply Circuit 103 to increase the voltage level of Adjustable Power Rail 123. Power Management Circuit 105 also asserts a first value on Control Signal 125 in response to determining that the increased voltage level of Adjustable Power Rail 123 will cross the voltage level of Shared Power Rail 121.

Further operations of the method may depend on a state of a control signal (block 408). Power Switch 114 receives Control Signal 125. Power Management Circuit 105 determines if Circuit Block 112b is powered by Shared Power Rail 121 or Adjustable Power Rail 123 and asserts or de-asserts Control Signal 125 accordingly. Power Management Circuit 105 may determine if Power Supply Circuit 103 has completed the request to increase the voltage level of Adjustable Power Rail 123 before asserting Control Signal 125 to switch Circuit Block 112b to Adjustable Power Rail 123. In other embodiments, Power Management Circuit 105 may wait for a predetermined amount of time from requesting the voltage level increase before asserting Control Signal 125. If Control Signal 125 is asserted, then the method moves to block 410 to couple Circuit Block 112b to Adjustable Power Rail 123. otherwise, Method 400 moves to block 412 to couple Circuit Block 112b to Shared Power Rail 121.

If Control Signal 125 is asserted, then a power node of Circuit Block 112b is coupled to Adjustable Power Rail 123 (block 410). When Control Signal 125 is asserted, Power Switch 114 couples Adjustable Power Rail 123 to a power node for Circuit Block 112b. Power Switch 114 may use transistors or other type of transconductance devices to disable Shared Power Rail 121 from the power node and couple the node to Adjustable Power Rail 123 instead.

If Control Signal 125 is de-asserted in block 408, then the power node of Circuit Block 112b is coupled to Shared Power Rail 121 (block 412). When Control Signal 125 is de-asserted, Power Switch 114 couples Shared Power Rail 121 to the power node for Circuit Block 112b and decouples Adjustable Power Rail 123 from the power node.

Power is maintained at an operational level during the switch between power rails (block 414). If switching to Adjustable Power Rail 123, then Power Switch 114 may couple Adjustable Power Rail 123 to the power node before decoupling Shared Power Rail 121, with an overlap in which both power rails are briefly coupled to the power node in order to keep at least one power rail coupled to the power node to avoid a power interruption in Circuit Block 112b. If switching to Shared Power Rail 121, then a similar process is used. Shared Power Rail 121 is coupled to the power node before Adjustable Power Rail 123 is decoupled. Power Switch 114 may assert acknowledge signal 127 once the switching is complete. In some embodiments, Power Switch 114 may assert a value on acknowledge signal 127 corresponding to the value of Control Signal 125. In other embodiments, Power Switch 114 may assert a pulse on acknowledge signal 127 to indicate the power rail switching is complete. The method ends in block 416.

It is noted that the method illustrated in FIG. 4 is an example for demonstration purposes. In some embodiments, additional operations may be included. Additionally, operations may be performed in a different order in various embodiments.

Figure 5:
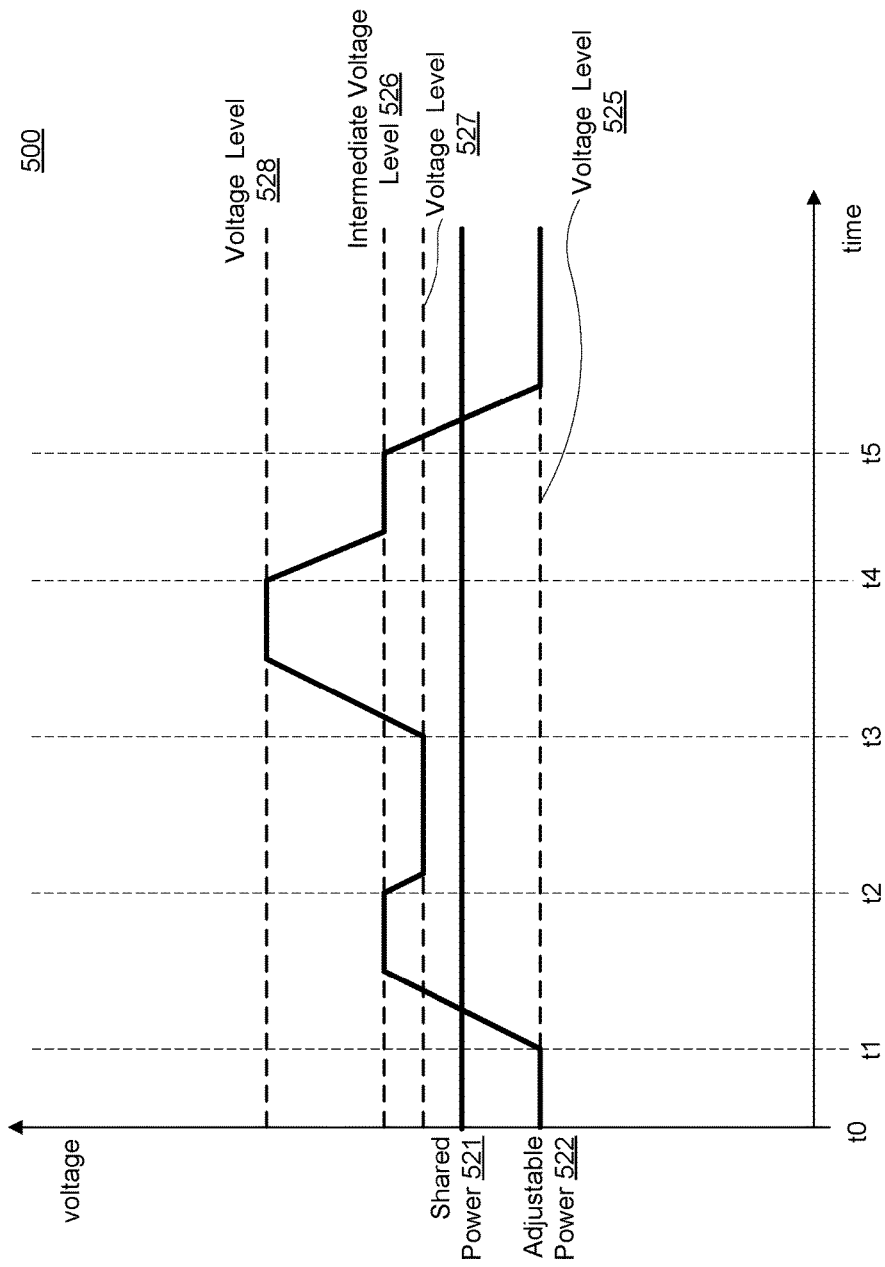
FIG. 5 shows a chart of another embodiment of a timing diagram illustrating voltage levels of various power signals associated with an SoC.

Moving now to FIG. 5, a chart of another embodiment of a timing diagram illustrating voltage levels of various power signals associated with an SoC is shown. Chart 500, in the illustrated embodiment, corresponds to signals associated with power management in an SoC, such as, for example, SoC 101 in FIG. 1. Chart 500 includes two signals: Shared Power 521, illustrating a voltage level of Shared Power Rail 121, and Adjustable Power 522, illustrating a voltage level of Adjustable Power Rail 122. In other embodiments, Adjustable Power 522 may correspond to Adjustable Power Rail 123. In addition, four particular voltage levels are indicated by dashed lines: Voltage Level 525, Intermediate Voltage Level 526, Voltage Level 527, and Voltage Level 528.

Similar to Chart 300 in FIG. 3, Chart 500 illustrates how voltage levels on Adjustable Power Rail 122 of SoC 101 may vary in relation to Shared Power Rail 121 over time. Chart 500 illustrates usage of Intermediate Voltage Level 526 to transition circuits, such as Circuit Blocks 111b, from Shared Power Rail 121 to Adjustable Power Rail 122. In the illustrated embodiment, at time t0, the voltage level of Adjustable Power 522 is at Voltage Level 525, which is less than the voltage level of Shared Power 521. Circuit Block 111a is powered from Adjustable Power 522 and Circuit Blocks 111b are powered from Shared Power 521. At time t0, Functional Circuit 107 may be in a reduced power mode.

At time t1, Functional Circuit 107 may begin a transition from the reduced power mode to an active mode. As part of the transition to the active mode, Functional Circuit 107 requests Power Management Circuit 105 to increase the voltage level of Adjustable Power 522 to Voltage Level 525, which is greater than the voltage level of Shared Power 521. Power Management Circuit 105 determines that the change in voltage level on Adjustable Power 522 crosses from less than to greater than the level of Shared Power 521. In response to this determination, Power Management Circuit 105 sends a request to Power Supply Circuit 103 to increase the level of Adjustable Power 522 to Intermediate Voltage Level 526. Once the level of Adjustable Power 522 has suitably settled at Intermediate Voltage Level 526, Power Management Circuit 105 asserts Control Signal 124 to cause Power Switch 113 to power Circuit Blocks 111b from Adjustable Power 522 instead of Shared Power 521. In various embodiments, Circuit Blocks 111b may be switched all at once, one at a time, or in any suitable combination.

At time t2, Power Switch 113 completes the transition of Circuit Blocks 111b to Adjustable Power 522. Power Switch 113 asserts Acknowledge Signal 126 to indicate that the transition is complete. In response, Power Management Circuit 105 sends a request to Power Supply Circuit 103 to change the level of Adjustable Power 522 to Voltage Level 527, thereby completing the transition to Voltage Level 527. It is noted, that although Voltage Level 527 is less than Intermediate Voltage Level 526, the transition to Voltage Level 527 still includes setting Adjustable Power 522 to Intermediate Voltage Level 526.

At time t3, Functional Circuit 107 sends a request to Power Management Circuit 105 to increase the level of Adjustable Power 522 to Voltage Level 528. Functional Circuit 107, may, for example, require a higher voltage level to complete a current task or to prepare for a new task. Since the change from Voltage Level 527 to Voltage Level 528 does not cross the level of Shared Power 521, Power Management Circuit 105 sends the request on to Power Supply Circuit 103 and the voltage level of Adjustable Power 522 is increased. Circuit Blocks 111b are already powered from Adjustable Power 522, so no additional transitions may be required by Power Switch 113.

At time t4, Functional Circuit 107 may have completed its tasks and be ready to return to the reduced power mode. In preparation for the transition to the reduced power mode, Functional Circuit 107 sends a request to Power Management Circuit 105 to reduce the level of Adjustable Power 522 to voltage Level 525. Power Management Circuit 105 determines that the level change crosses the level of Shared Power 521, and therefore, Circuit Blocks 111b will need to be switched to Shared Power 521 before the level of Adjustable Power 522 is change to Voltage Level 525. Power Management Circuit 105 sends a request to Power Supply Circuit 103 to change the level of Adjustable Power 522 to Intermediate Voltage Level 526. Once the level of Adjustable Power 522 is suitably settled at Intermediate Voltage Level 526, Power Management Circuit 105 de-asserts Control Signal 124, resulting in Power Switch 113 transitioning Circuit Blocks 111b from Adjustable Power 522 to Shared Power 521. Again, the transitioning of Circuit Blocks 111b may be performed in any suitable order.

Upon completing the transitioning of Circuit Blocks 111b to Shared Power 521, Power Switch 113 asserts Acknowledge Signal 126 to indicate the transition is complete at time t5. Power Management Circuit 105 sends a request to Power Supply Circuit 103 to change the level of Adjustable Power 522 to Voltage Level 525. Functional Circuit 107, in various embodiments, may enter the reduced power mode in response to the assertion of Acknowledge Signal 126 or may wait until the level of Adjustable Power 522 has suitable settled at Voltage Level 525.

In the embodiment of FIG. 5, if a change to the current voltage level of Adjustable Power 522 to a target voltage level results in the level of Adjustable Power 522 crossing the voltage level of Shared Power 521, then the level of Adjustable Power 522 is set to Intermediate Voltage Level 526 before being set to the target voltage level. When the target voltage level is above the level of Shared Power 521, Circuit Blocks 111b are switched to be powered by Adjustable Power 522 after Adjustable Power 522 is suitably settled at Intermediate Voltage Level 526. When the target voltage level is below the level of Shared Power 521, Circuit Blocks 111b are switched to be powered by Shared Power 521 after Adjustable Power 522 is suitably settled at Intermediate Voltage Level 526. Switching circuits while an adjustable power rail is at an intermediate voltage level may allow for circuits to be switched between an adjustable power rail and a shared power rail when the voltage level difference between the two power rails is at a known delta. This delta amount may be selected, in various embodiments, to accommodate for load changes to and from the power rails while mitigating risks of power drooping below or spiking above safe operating levels due to the change in the load being powered by each rail. The delta may also be programmable, by, for example, Power Management Circuit 105 or a processor in SoC 100. Although the intermediate voltage level is shown to be greater than the voltage level of Shared Power 521, in other embodiments, the delta may be programmed to be less than the voltage level of Shared Power 521. In some embodiments, using an intermediate voltage level for level changes that cross a level of a shared power rail may simplify circuitry in a power management circuit.

It is noted that Chart 500 in FIG. 5 is merely an example. The illustrated waveforms have been simplified for clarity. In other embodiments, the waveforms may differ due to system noise and/or imperfections in IC manufacturing. Although Chart 500 is described in relation to Functional Circuit 107, the embodiment of FIG. 5 may be applicable to any functional circuit in SoC 101 that utilizes a shared power rail and an adjustable power rail.

Figure 6:
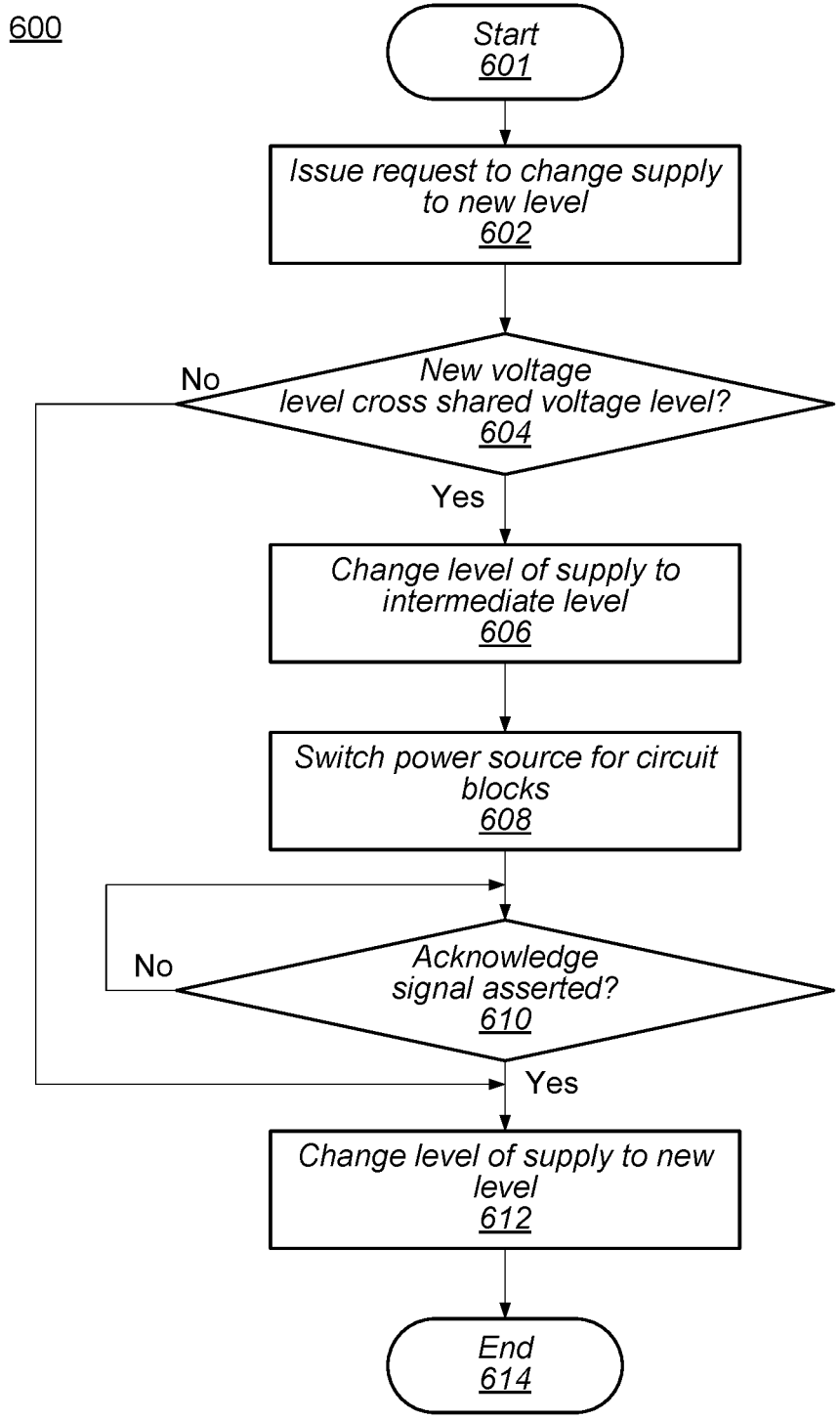
FIG. 6 depicts a flow diagram of an embodiment of a method for multiplexing power rails in an SoC using an intermediate voltage level.

Turning to FIG. 6, a flow diagram of an embodiment of a method for multiplexing power rails in an SoC using an intermediate voltage level is shown. Method 600 may be applied to an SoC, such as, for example, SoC 101 in FIG. 1. Referring collectively to FIG. 1 and the method of FIG. 6, method 600 begins in block 601.

A power management circuit issues a request to a power supply unit to change a voltage level of a power rail (block 602). A power management circuit, such as Power Management Circuit 105, for example, sends a requests to a power supply circuit such as, e.g., Power Supply Circuit 103, to change a voltage level of an adjustable power rail, such as Adjustable Power Rail 123, from a current voltage level to a new voltage level. In the illustrated embodiment, Functional Circuit 108 initially sends a requests to change the voltage level to Power Management Circuit 105, although, in other embodiments, Power Management Circuit 105 may initiate the request.

Further operations of Method 600 may depend on the new voltage level (block 604). In the illustrated embodiment, Power Management Circuit 105 determines if the level of Adjustable Power Rail 123 will cross the level of Shared Power Rail 121 when changing from the current voltage level to the new voltage level. In some embodiments, an additional determination is made whether the current voltage level and the new voltage level of Adjustable Power Rail 123 differ from the voltage level of Shared Power Rail 121 by more than an offset value. If the level of Adjustable Power Rail 123 will cross, then the power source for Circuit Block 112b may be switched. If the level of Adjustable Power Rail 123 is increasing, then the power source for Circuit Block 112b may be switched from Shared Power Rail 121 to Adjustable Power Rail 123, and vice versa if the level of Adjustable Power Rail 123 is decreasing. If the level of Adjustable Power Rail 123 will cross the level of Shared Power Rail 121, then Method 600 moves to block 606 to change the level of Adjustable Power Rail 123 to an intermediate voltage level. Otherwise, the method moves to block 612 to change the level of Adjustable Power Rail 123 to the new voltage level.

If the level of Adjustable Power Rail 123 will cross the level of Shared Power Rail 121, then the level of Adjustable Power Rail 123 is changed to the intermediate voltage level (block 606). Power Management Circuit 105 sends a request to Power Supply Circuit 103 to change the voltage level of Adjustable Power Rail 123 to the intermediate voltage level. The change to the intermediate voltage level may occur regardless of the new voltage level. For example, referring to Chart 500 of FIG. 5, if the level of Adjustable Power Rail 123 is increasing from Voltage Level 525 to Voltage Level 527, the level of Adjustable Power Rail 123 will be set to Intermediate Voltage Level 526 before being set to Voltage Level 527. One reason for switching to the intermediate voltage level first may be to have a consistent voltage level difference, or delta, between the levels of Shared Power Rail 121 and Adjustable Power Rail 123 while switching a power source for Circuit Block 112b from one power rail to the other. Using a consistent voltage level delta may tend to reduce erroneous operation of or avoid damage to Circuit Block 112b and Power Switch 114 during the transition between the power rails. The intermediate voltage level may be selected such that in a make-before-break switch (e.g., both power rails are coupled to Circuit Block 112b before one is decoupled), current flowing from the power rail with the higher voltage level to the rail with the lower voltage level is an acceptable amount.

A power source for Circuit Block 112b is switched (block 608). In some embodiments, Power Supply Circuit 103 may indicate to Power Management Circuit 105 that the new voltage level for Adjustable Power Rail 123 has been set. Power Management Circuit 105 may assert (or de-assert in other embodiments) Control Signal 125, causing Power Switch 114 to transition the power source for Circuit Block 112b. If the new voltage level will be above the level of Shared Power Rail 121, then the power source for Circuit Block 112b may be switched from Shared Power Rail 121 to Adjustable Power Rail 123, and vice versa if the new voltage level is less than the level of Shared Power Rail 121. If the power source for more than one circuit block is transitioning, then Power Switch 114 may transition each circuit block one at a time, in groups, or all at once.

Continuing operations of Method 600 may depend on an acknowledge signal (block 610). Once Power Switch 114 has completed the transition of the power source for Circuit Block 112b, then Power Switch 114, in the illustrated embodiment, asserts acknowledge signal 127. Method 600 remains in block 610 until Power Switch 114 asserts acknowledge signal 127. After acknowledge signal 127 is asserted, then the method moves to block 612 to change the level of Adjustable Power Rail 123.

After Circuit Block 112b has been coupled to the appropriate power rail, the level of Adjustable Power Rail 123 is changed to the new voltage level (block 612). Power Management Circuit 105 receives the asserted acknowledge signal from Power Switch 114, and, in response, sends a request to Power Supply Circuit 103 to change the voltage level of Adjustable Power Rail 123 to the new level. The method ends in block 614.

It is noted that Method 600 of FIG. 6 is merely an example. In some embodiments, operations may be performed in a different order. Additionally, in various embodiments additional operations may be included.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A system, comprising:
   a plurality of functional circuits;
   a power supply circuit configured to:
      generate a shared power signal coupled to the plurality of functional circuits; and
      generate an adjustable power signal coupled to a particular functional circuit of the plurality of functional circuits; and
   a power management circuit configured to send a request to the power supply circuit to change a voltage level of the adjustable power signal from a first voltage level to a second voltage level;
   wherein the particular functional circuit is configured to:
      selectively couple a power node included in the particular functional circuit to either of the shared power signal or the adjustable power signal based on a control signal; and
      maintain an operational voltage level on the power node when selectively coupling the power node to either of the shared power signal or the adjustable power signal.

2. The system of claim 1, wherein the power management circuit is further configured to assert the control signal in response to a determination that the first voltage level is greater than a voltage level of the shared power signal and the second voltage level is less than the voltage level of the shared power signal.

3. The system of claim 1, wherein to change the voltage level of the adjustable power signal from the first voltage level to the second voltage level, the power supply circuit is further configured to change the voltage level of the adjustable power signal to an intermediate voltage level in response to the request from the power management circuit.

4. The system of claim 3, wherein the power management circuit is further configured to de-assert the control signal to cause the particular functional circuit to switch the power node in the particular functional circuit from the adjustable power signal to the shared power signal in response to a determination that the voltage level of the adjustable power signal has reached the intermediate voltage level.

5. The system of claim 4, wherein the particular functional circuit is further configured to assert an acknowledge signal in response to a determination that the power node in the particular functional circuit is coupled to the shared power signal.

6. The system of claim 5, wherein the power supply circuit is further configured to change the voltage level of the adjustable power signal to the second voltage level in response to the assertion of the acknowledge signal.

7. The system of claim 1, wherein the power management circuit is further configured to leave the control signal asserted in response to a determination that both the first voltage level and the second voltage level are greater than the voltage level of the shared power signal.

8. A method comprising:
generating, by a power supply circuit, a shared power signal coupled to a particular functional circuit included in a plurality of functional circuits;
generating, by the power supply circuit, an adjustable power signal coupled to the particular functional circuit;
requesting, by a power management circuit, to change a voltage level of the adjustable power signal from a first voltage level to a second voltage level;
selectively coupling, by the particular functional circuit, a power node included in the particular functional circuit to either of the shared power signal or the adjustable power signal based on a control signal; and
maintaining an operational voltage level on the power node when selectively coupling the power node to either of the shared power signal or the adjustable power signal.

9. The method of claim 8, further comprising asserting the control signal, by the power management circuit, in response to a determination that the first voltage level is less than a voltage level of the shared power signal and the second voltage level is greater than the voltage level of the shared power signal.

10. The method of claim 8, further comprising asserting the control signal, by the power management circuit, in response to determining that the first voltage level is less than a threshold voltage level and the second voltage level is greater than the threshold voltage level, wherein the threshold voltage level differs from the voltage level of the shared power signal by a programmable offset.

11. The method of claim 8, wherein changing the voltage level of the adjustable power signal from the first voltage level to the second voltage level comprises changing, by the power supply circuit, the voltage level of the adjustable power signal to an intermediate voltage level.

12. The method of claim 11, switching the power node from the adjustable power signal to the shared power signal in response to determining that the voltage level of the adjustable power signal has reached the intermediate voltage level.

13. The method of claim 12, further comprising asserting an acknowledge signal, by the particular functional circuit, in response to a determination that the power node is coupled to the shared power signal.

14. The method of claim 13, further comprising changing the voltage level of the adjustable power signal to the second voltage level in response to the assertion of the acknowledge signal.

15. The method of claim 11, wherein the intermediate voltage level is greater than both the first voltage level and the second voltage level.

16. An apparatus, comprising:
a circuit block including a power node;
a power multiplexing circuit coupled to a shared power signal and to an adjustable power signal, and configured to:
selectively couple the power node to either of the shared power signal or the adjustable power signal based on a control signal; and
maintain an operational voltage level on the power node when selectively coupling the power node to either of the shared power signal or the adjustable power signal.

17. The apparatus of claim 16, wherein the power multiplexing circuit is further configured to:
couple the power node to the to the adjustable power signal while the shared power signal is coupled to the power node; and
decouple the shared power signal from the power node after the adjustable power signal has been coupled to the power node.

18. The apparatus of claim 16, wherein the power multiplexing circuit is further configured to:
couple the power node to the to the shared power signal while the adjustable power signal is coupled to the power node; and
decouple the adjustable power signal from the power node after the shared power signal has been coupled to the power node.

19. The apparatus of claim 18, wherein to decouple the adjustable power signal from the power node, the power multiplexing circuit is further configured to delay a transition of an adjustable power disable signal.

20. The apparatus of claim 16, wherein the power multiplexing circuit is further configured to shift a logic voltage level of the control signal from a voltage level of the shared power signal to a voltage level of the adjustable power signal.

* * * * *